United States Patent
Park et al.

[11] Patent Number: 5,968,840
[45] Date of Patent: Oct. 19, 1999

[54] DYNAMIC RANDOM ACCESS MEMORY USING SILICON-ON-INSULATOR TECHNIQUES

[75] Inventors: Kyucharn Park, Kyungki-do; Yeseung Lee; Cheonsu Ban, both of Seoul; Kyungwook Lee, Kyungki-do, all of Rep. of Korea

[73] Assignee: Samsung Electronics Co., Ltd., Suwon, Rep. of Korea

[21] Appl. No.: 08/439,084

[22] Filed: May 11, 1995

Related U.S. Application Data

[62] Division of application No. 08/170,589, Dec. 22, 1993, abandoned.

[30] Foreign Application Priority Data

Dec. 30, 1992 [KR] Rep. of Korea ................ 92-26778

[51] Int. Cl.[6] ................................... H01L 21/8242
[52] U.S. Cl. ................ 437/52; 437/60; 437/203; 437/919
[58] Field of Search .............. 437/919, 52, 60, 437/47, 203

[56] References Cited

U.S. PATENT DOCUMENTS 4,992,135  2/1991  Doan ........................ 156/636
5,414,655  5/1995  Ozaki et al. .

Primary Examiner—Jey Tsai
Attorney, Agent, or Firm—Samsung Electronics Co., Ltd.

[57] ABSTRACT

The present invention discloses a method for making a dynamic random access memory by silicon-on-insulator comprising the steps of: dividing a cell area and a peripheral area on a first silicon substrate and recessing just the cell area where a memory device is formed; forming a first insulating layer by isolation of electrical elements in order to divide an active region and a passive region; forming and patterning a first conductive layer through a contact to which the active region and a capacitor are connected on the insulating layer to form a storage node; forming a dielectric layer of the capacitor on the storage node; forming and patterning a polysilicon layer on the dielectric layer to form a storage node; forming a second insulating layer on the plate node and planarizing the insulating layer by thermal treatment; forming a third conductive layer to a predetermined thickness on the planarized insulating layer; polishing and planarizing the third conductive layer by chemical-mechanical polishing technique, using the second insulating layer as an etchstopper and bonding a second silicon substrate on the planarized third conductive layer; planarizing a backside of the first substrate by a chemical-mechanical polishing technique and exposing the active region; and forming a switching element on the forming a bit line.

15 Claims, 9 Drawing Sheets

FIG. 1
(PRIOR ART)
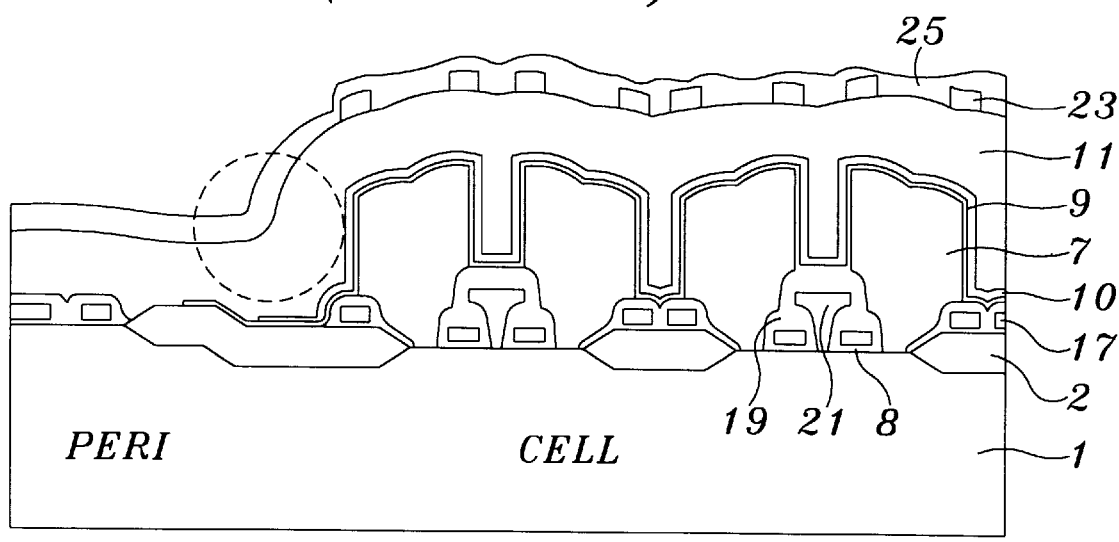
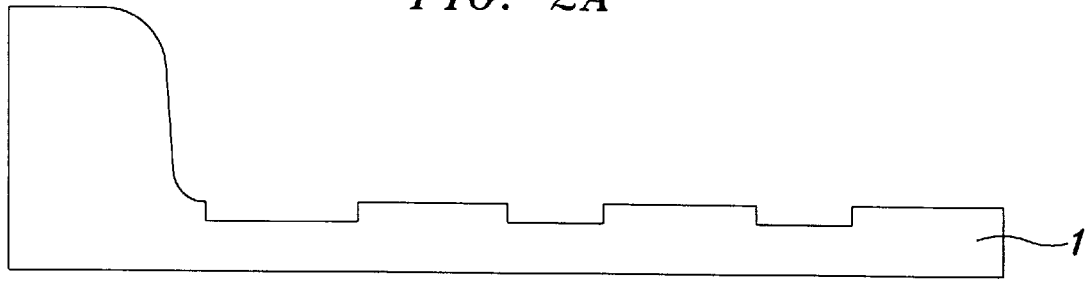
FIG. 2A
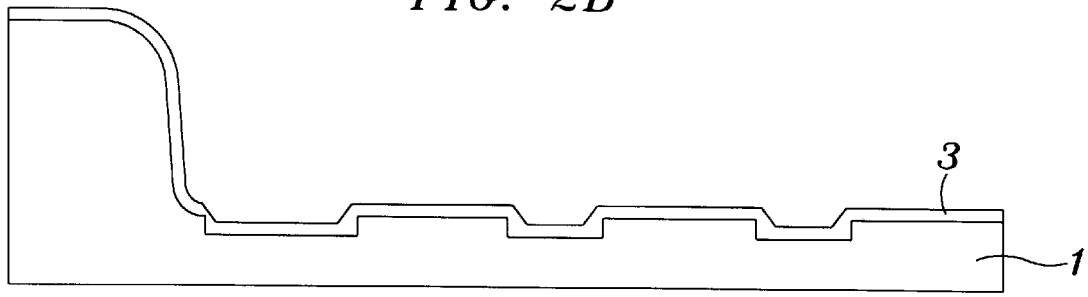
FIG. 2B
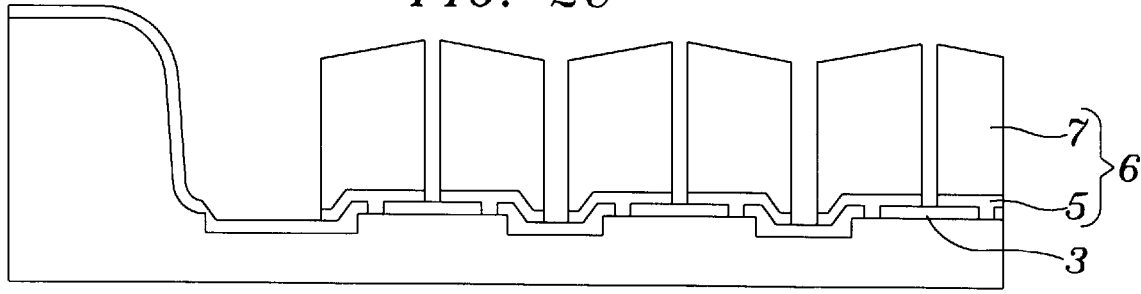
FIG. 2C

DYNAMIC RANDOM ACCESS MEMORY USING SILICON-ON-INSULATOR TECHNIQUES

This is a division of application Ser. No. 08/170,589, filed Dec. 22, 1993.

BACKGROUND OF THE INVENTION (1) Field of the Invention

The present invention relates generally to a method for making a dynamic random access memory (DRUM). More particularly, the present invention relates to a method for making a DRAM using a modified silicon-on-insulator (SOI) technology in which transistors are formed by silicon direct bonding (SDB) following chemical-mechanical polishing (CMP) of a substrate surface, and after storage cell capacitors have been formed by SDB and use of SOI techniques. In addition, the present invention relates to a method for making a DRAM in which SOI devices are formed on only specific areas of the DRAM including the memory cells.

(2) Description of the Prior Art

Remarkable progress has been made in the manufacture of ever more highly integrated DRAMS. For example, 4 Mbit DRAMs have now supplanted 1 Mbit DRAMs as the industry's standard memory device.

Unfortunately, as conventional semiconductor memory devices shrink in size, it becomes increasingly difficult to obtain devices having memory cells of sufficient capacitance.

In conventional, highly integrated DRAMs, the predetermined capacitance of the memory cell storage capacitor must be kept relatively constant, in spite of the decreased surface area occupied by each of the cell. For example, in a 64 Mbit DRAM each storage cell is allocated an area of only 0.8 $\mu m^2$ to 1.0 $\mu m^2$.

In situations where the area allocated to each storage cell decreases to the point where cell capacitance becomes inadequate to hold the requisite charge, a soft error may occur upon exposure of the memory cell to $\alpha$-light, thus creating reliability problems for the semiconductor memory device. Accordingly, the capacitance of storage cell capacitors must be kept relatively constant to avoid such errors, in spite of the necessary decrease in surface area allocated to individual storage cell capacitors.

In current conventional DRAMs having memory cells based on transistor-stacked capacitor combinations, one of a pair of storage capacitor electrodes is routinely formed with a three-dimensional structure. This three-dimensional structure increases cell capacitor capacitance by 30 to 40%, as compared with two-dimensional capacitor structures of similar size. Three-dimensional capacitor structures are but one example of recent efforts to increase memory cell capacitance without increasing the area allocated for each cell. Improved materials having high dielectric constants have also been studied. One proposed method for obtaining higher cell capacitance in defined small areas is described in an article entitled "A 1.28 $\mu m$ Bit-Line Shielded Memory Cell Technology for 64 MB DRAMS" presented at the 1990 symposium of VLSI TECHNOLOGY.

Conventional CMOS memory devices suffer from a plurality of design and performance problems. Among these, current fabrication processes and resulting structures may inadvertently create active parasitic devices within the memory device structure, such as parasitic metal oxide semiconductor transistors, or parasitic polar transistors in a PN junction-separation structure. In addition, common problems include the deterioration of electrical devices within the memory device, and the occurrence of soft errors due to the latch-up phenomenon. In order to prevent these problems while attaining higher integration densities, silicon-on-insulator (SOI) techniques have been studied wherein insulating layers are formed as sidewalls of an insulating substrate formed of a material such as SiO2, and wherein silicon single crystalline wells are formed in these insulating layers to form semiconductor devices.

These techniques have advantages of perfect isolation of electrical elements, and high speed performance free from latch-up and soft errors. Other advantages include the ability to determine the width of insulating layers for isolation based upon photo-etching process steps, etc. Finally, increased integration based on the micro-miniaturization can be obtained in an environment which allows application of three-dimensional devices.

According to the above techniques, a semiconductor device having a SOI structure is formed by forming an amorphous or polysilicon layer on an amorphous insulating substrate such as $SiO_2$ and by performing recrystallization on the polysilicon layer. Separation by implanted oxygen (SIMOX) processes and full isolation by porous oxidized silicon (FIPOS) processes are also known as another approach.

However, these techniques are not without their drawbacks. When it comes to SIMOX technologies, a specially designed oxide ion implanting means is required to form an insulating layer inside the substrate. The FIPOS processes require anodization for just these processes. Zone melting (ZMR) requires recrystallization.

A method of forming a conventional DRAM is now described with reference to FIG. 1. In FIG. 1, a field oxide layer 2 is formed by a selective oxidation on a silicon substrate 1 and isolation of electrical elements is performed. After that, a gate oxide 8 is grown, and a gate electrode 17 is patterned to form a source/drain region. Inter layer insulation is carried out by an oxide layer 19 formed by a chemical vapor deposition method. Next, a conductive layer 21 is deposited and patterned.

After a second interlayer insulation is carried out, a contact hole is opened so that a lower capacitor electrode 7 contacts the substrate. Thereafter, lower electrode 7 is patterned. A dielectric layer 10 and an upper electrode 9 are then formed.

Successively, after a third interlayer insulation is performed, a protective layer 25 is finally formed to complete the manufacture of the semiconductor memory cell.

As shown in the above process, a memory cell having sufficient capacitance is attained in the manufacture of the highly integrated DRAM by use of three-dimensional type stack capacitors. Unfortunately, in stack type capacitor applications greater than 64 Meg, the storage cell obtains a very high profile in order to obtain the required capacitance. If the storage cell (or node) is elevated in this manner, a large step-like difference between the memory cell part and a peripheral part occurs such that contact or metallization can not be easily performed.

In the formation of P-MOS transistors, the thermal budget should be small in order to maintain transistor characteristics and the isolation of electrical elements. As a result, it is hard to perform planarization by borophosphorsilicate glass (BPSG) flow due to this condition.

Increased DRAM integration brings with it increased difficulty in forming patterns. That is, not only is the size of patterns small, but also high overlay accuracy is necessary. Since there is a large step-like difference resulting from the height of the cell capacitor, it is difficult to secure a sufficient alignment margin.

If device planarity is increased so as to remove the step-like difference, the depth of the contact metallization must be increased. Various problems may occur by step-coverage or etch damage. One study tried to solve these problems by first forming a capacitor by direct wafer bonding and silicon-on-insulator processes, and thereafter forming transistors on the opposite silicon surface. However, if a DRAM cell is made this way, peripheral circuit devices become SOI devices, and it is difficult to find a processing condition that meets both characteristics.

That is to say, n-type MOS and p-type MOS transistors having different widths and lengths should preferably be made into SOI devices, but heretofore it has been difficult to form active devices of different size using a SOI technique.

SUMMARY OF THE INVENTION

The present invention provides a method for making a DRAM capable of preventing deterioration in the characteristics of a transistor due to subsequent thermal treatment. The present invention also addresses the problems associated with a grounding plate. These benefits result, at least in part, from the formation of a transistor after a cell area has been deeply recessed on a semiconductor substrate.

The present invention provides a method for making a DRAM using a silicon-on-insulator technique so as to maintain the advantages of direct wafer bonding (DWB) and silicon-on-insulator (SOI) techniques and to apply the technique applied to the bulk silicon directly to the peripheral circuit devices. This benefit can be achieved by forming an access transistor in a cell area on a silicon-on-insulator of less than 100 $\mu$m, and by forming devices other than the access transistor on a silicon-on-insulator of more than 1 $\mu$m so as to display characteristics of devices formed on the bulk silicon.

In accordance with a first preferred embodiment, a method for making a dynamic random access memory by silicon-on-insulator comprises the steps of:

dividing a cell area and a peripheral area on a first silicon substrate and recessing just the cell area where a memory device is formed;

forming a first insulating layer by isolation of electrical elements in order to divide an active region and a passive region;

forming and patterning a first conductive layer through a contact to which the active region and a capacitor are connected on the insulating layer to form a storage node;

forming a dielectric layer of the capacitor on the storage node;

forming and patterning a polysilicon layer on the dielectric layer to form a storage node;

forming a second insulating layer on the plate node and planarizing the insulating layer by thermal treatment;

forming a third conductive layer to a predetermined thickness on the planarized insulating layer;

polishing and planarizing the third conductive layer by chemical-mechanical polishing technique, using the second insulating layer as an etchstopper and bonding a second silicon substrate on the planarized third conductive layer;

planarizing a backside of the first substrate by a chemical-mechanical polishing technique and exposing the active region; and forming a switching element on the forming a bit line.

The dynamic random access memory made by silicon-on-insulator according to the first embodiment, comprises:

an active silicon layer formed to be divided into several parts and separated from each other by chemically and mechanically polishing and planarizing a backside of a first substrate having a recessed cell area where a memory device will be formed;

a first insulating layer formed to be divided into an active region and a passive region on the active silicon layer;

a storage node formed on right and left sides of a contact on the first insulating layer;

a plate node formed on the storage node;

a second insulating layer formed on the plate node;

a handling wafer bonded to a pattern of a polysilicon layer deposited on the second insulating layer and polished chemically and mechanically and planarized;

a gate electrode formed on the active silicon layer;

a third insulating layer formed to be divided into several parts and separated from each other on the active silicon layer where the gate electrode is formed; and a bit line formed on the third insulating layer.

In accordance with a second preferred embodiment of this invention, a method for making a dynamic random access memory by silicon-on-insulator comprises the steps of:

recessing a specified area including a dynamic random access memory cell is formed on a silicon substrate;

forming a well on the substrate;

forming a trench in order to isolate electrical elements between cells in the recessed area and form an align-key;

filling the trench with buried oxide;

forming a buried contact on the buried oxide;

forming a capacitor;

planarizing a pattern formed by the processes;

bonding an active wafer passed the processes to a handle wafer;

removing a silicon of the active wafer to a bottom of the trench;

wet-etching a silicon layer formed on an area that is not recessed on the silicon substrate and performing isolation of electrical elements by means of a local oxidation of silicon process;

forming devices of a peripheral circuit such as n-type and p-type metal oxide semiconductors and a register pattern in a conventional manner;

forming devices such as a metal oxide semiconductor and a transistor on the recessed area of the silicon substrate;

forming contacts simultaneously on a plate node, a cell, a gate and a metallization of the peripheral circuit and on a bit line, respectively;

forming simultaneously a bit line of the cell area and the metallization of the peripheral circuit; and carrying out passivation and alloying on the pattern.

BRIEF DESCRIPTION OF THE DRAWINGS

The above and further objects, features and advantages of the present invention will become more apparent from the following detailed description of embodiments taken in conjunction with the accompanying drawings.

FIG. 1 is a sectional view of a conventional dynamic random access memory (DRAM);

FIGS. 2A to 2G depict the steps in the manufacture of a DRAM by silicon-on-insulator processes in accordance with a first preferred embodiment of this invention;

FIGS. 3A to 3I depict the steps in the manufacture of a DRAM by silicon-on-insulator processes in accordance with a second preferred embodiment of this invention;

DESCRIPTION OF THE PREFERRED EMBODIMENTS

Figure 2D:
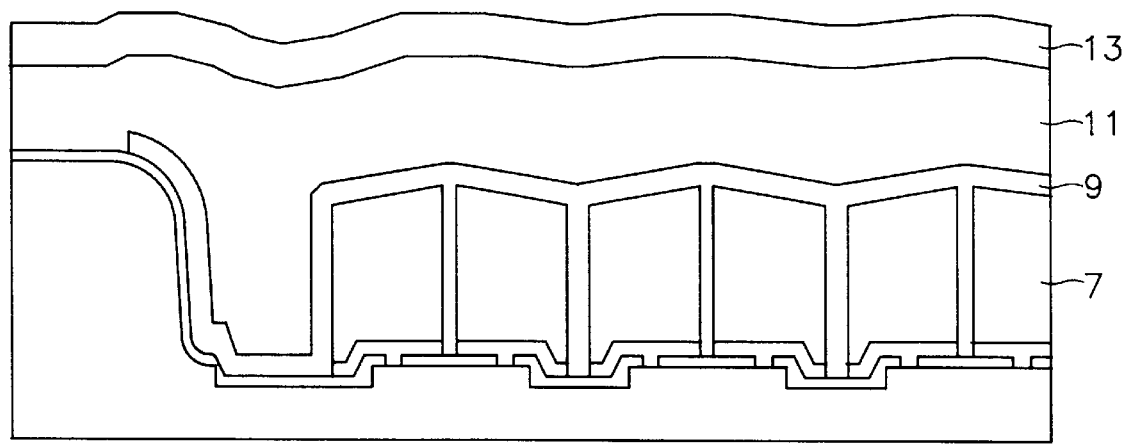

A detailed description of the present invention will now be made referring to the accompanying drawings.

A first preferred embodiment of a method for making a dynamic random access memory (DRAM) using silicon-on-insulator (SOI) techniques is described as follows. FIGS. 2A to 2G depict steps in the preferred method for the manufacture of a DRAM using silicon-on-insulator processes in accordance with the first preferred embodiment of the present invention.

As shown in FIG. 2A, the method of manufacturing a dynamic random access memory (DRAM) includes a first step of dividing a first single crystalline silicon substrate 1 into a "cell part" and a "peripheral part," and deeply recessing a portion of the substrate in only the cell part where a memory device will ultimately be formed.

Next, as shown in FIG. 2B, a first insulating layer 3 is formed to separate an active region from a passive region. A first conductive polysilicon layer comprising conductive polysilicon layer portions 5 and 7, is formed on insulating layer with conductive polysilicon layer portion 5 formed in contact with substrate 1 through a contact hole. The active region and capacitor are thus connected, as shown in FIG. 2C to form a storage node 6.

Thereafter, as shown in FIG. 2D, a capacitor dielectric layer (not shown), and a second polysilicon layer are formed and patterned on storage node 6 to form a plate node 9. Next, a second insulating layer 11 is formed and patterned on plate node 9, and thereafter planarized. A third polysilicon layer 13 is formed to a predetermined thickness on the planarized second insulating layer 11.

Figure 2E:
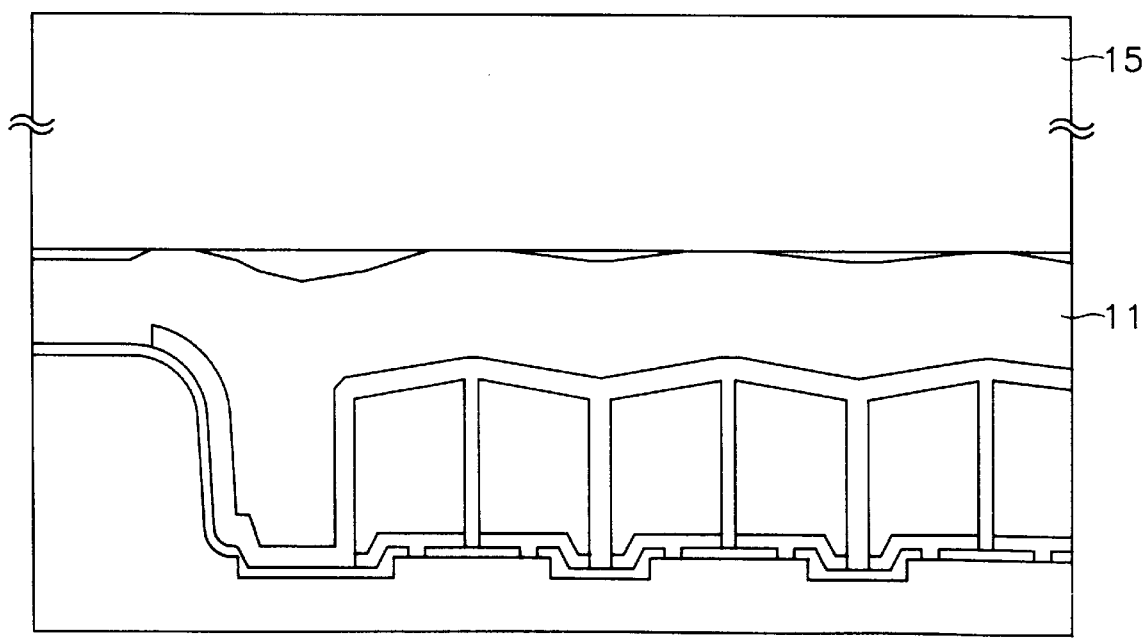

Referring to FIG. 2E, third polysilicon layer 13 is subsequently polished, chemically and mechanically, using second insulating layer 11 as an etchstopper.

After bonding a handling wafer 15 on the polished surface of the resulting structure an active silicon layer 1' is exposed by thinning a backside part of first substrate 1 using a chemical-mechanical polishing method. See FIG. 2F.

Figure 2F:
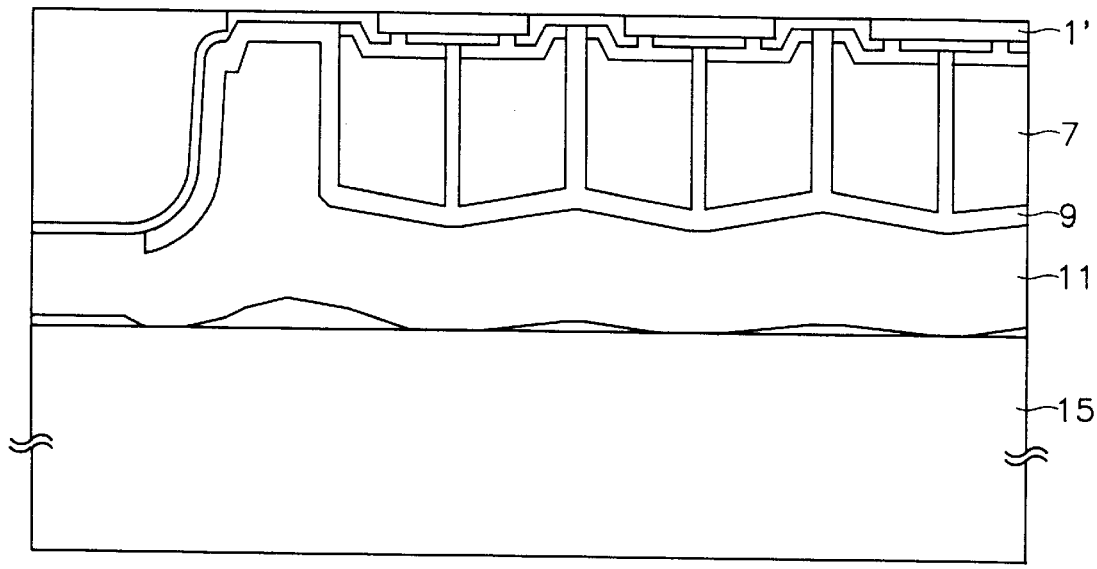
Figure 2G:
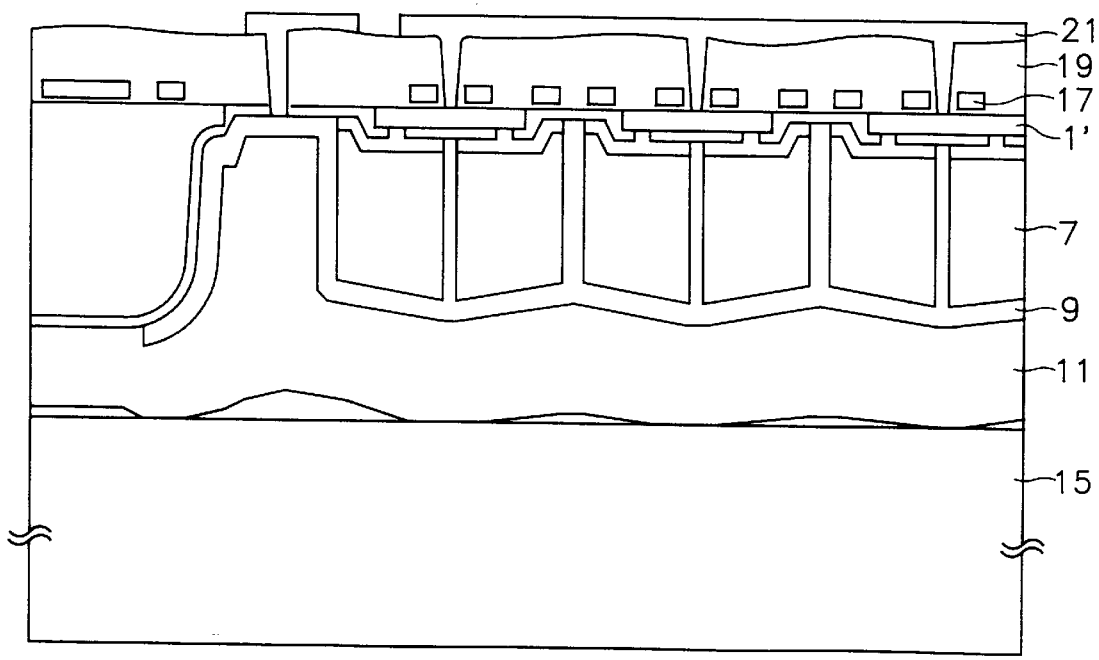

Referring to FIG. 2G, a gate electrode 17 is formed on active silicon layer 1'. Finally, a predetermined access device is formed by applying a third insulating layer 19 and forming a bit line 21.

To explain the above processes in greater detail, the cell part of the substrate where a memory device is ultimately formed is deeply recessed after the cell part and peripheral part have been divided on single-crystalline silicon substrate 1, as shown in FIG. 2A.

The cell part is recessed more than the height of the memory device capacitor. After just the part that will be isolated in the recessed cell part is etched to a thickness of more than 500 angstroms using a shallow trench technique, an oxide layer is then formed to cure damage caused by the etching process, and a high temperature oxide (HTO) and a borophosphorsilicate glass (BPSG) are united with each other to form insulating layer 3 having a thickness sufficient to perform its isolation function.

A first conductive layer of polysilicon having portions 5 and 7 is formed on insulating layer 3 to a predetermined thickness, such that sufficient capacitance can be obtained through the contact to which the active region and capacitor are connected. After patterning first conductive layer (5,7), storage node 6 is formed. The first conductive layer is deposited by a differential doped polysilicon deposition that forms a doped polysilicon layer 7 thickly, after an undoped polysilicon layer 5 is thinly formed. When a junction of the source region is formed by a successive thermal treatment after the capacitor processes, the above method step prevents the junction from being formed too deeply. The first conductive layer is patterned to form storage node 6.

Dielectric layers of the capacitor are formed of various high dielectric materials such as oxide film/nitride film/oxide film that does not appear on the pattern where storage node 6 is formed as shown in FIG. 2D. The second polysilicon conductive layer is formed and patterned to form plate node 9, thereby completing the capacitor formation processes.

After second insulating layer 11, in which HTO and BPSG are united, is thickly formed and planarized by thermal treatment, third polysilicon layer 13 is formed to a predetermined thickness.

As shown in FIG. 2E, polysilicon layer 13 is planarized by CMP method in which insulating layer 11 serves as an etch stopper, and a glass side of handling wafer 15 is bonded on the planarized polysilicon layer. The bonding method is conventional, i.e. the bonding is performed by thermal treatment.

Referring now to FIG. 2F, the resulting structure is turned upside down, and the backside of the wafer where the capacitors are formed is polished by CMP method using insulating layer 3 as an etch stopper.

Successively, as shown in FIG. 2G, gate electrode 17 is formed on the remaining active silicon layer 1', and the source/drain region is made by ion-implantation to form switching elements. After that, insulating layer 19 is applied and bit line 21 is formed.

The above-mentioned contact is formed on the borderline between the cell part and the peripheral part to be connected with plate node 9. The second conductive layer of the capacitor formed in the opposite side. The plate node 9 can be grounded after insulating layer 3 formed in the field area and the dielectric layer for the capacitor are removed completely.

After metallization and passivation processes, the memory device according to the present invention is completed.

A second preferred embodiment of a method for manufacturing a DRAM using SOI technology is described as follows.

FIGS. 3A to 3I depict the steps in the second preferred embodiment of the present invention. FIG. 4 depicts a joining machine used during the manufacture of the DRAM in accordance with the second preferred embodiment of this invention.

In the method steps for making a DRAM in accordance with the second preferred embodiment of this invention, access transistors for cell areas are formed on SOI having a thickness of less than 100 nm. Devices other than the access transistors are formed on SOI having a thickness of 1 μm so as to display the characteristics of the devices formed on bulk silicon.

The method steps include a first step of recessing certain portions of a silicon substrate 100 including portions of the substrate where DRAM cells are formed; a second step of forming wells on the substrate; a third step of forming a trench 104 to isolate electrical elements between cells and form align-keys on the recessed area; a fourth step of filling trench 104 with a buried oxide 106; a fifth step of forming a buried contact 108 on buried oxide 106; a sixth step of forming capacitors; a seventh step of planarizing the resulting structure formed by the above steps; an eighth step of cutting an active wafer on which the above steps are carried out to join it to a handle wafer 112; a ninth step of recessing the silicon on the active wafer nearly to the bottom of the trench formed in the third step; a tenth step of wet-etching the silicon formed on the area that is not recessed in the first step and isolating electrical elements by a local oxidation of silicon (LOCOS) process; an eleventh step of forming peripheral circuit devices such as n-type MOS and p-type MOS transistors and register patterns after the above processes; a twelfth step of forming MOS transistors on the recessed area of the silicon substrate; a thirteenth step of simultaneously forming contacts and bit-line contacts on a plate node, a cell, gate electrodes of a peripheral circuit and a line of the peripheral circuit; a fourteenth step of forming a bit line of the cell area and a line of the peripheral circuit; and a fifteenth step of carrying out passivation and alloying on the pattern after the above steps.

The above steps will now be described in greater detail with reference to the drawings.

As a first step, boron and Ge are ion-implanted by a high energy of $1E20/cm^2$ on a bare silicon 100. An etchstopper layer 102 is then formed on substrate 100 for use as an etchstopper when the active wafer is thinned in a subsequent process step. After direct wafer bonding (DWB) treatment, the silicon of the area where a thin SOI is formed is wet-etched to a thickness of I and recessed. Recessing the oxide layer after local oxidation instead of the wet etching may be available but it has a difficulty of recessing the oxide layer to a depth of more than 1 μm. The recess by wet-etching the silicon has a problem of uniformity of recessed depth. Therefore, boron and Ge are ion-implanted by a high energy of $1E20/cm^2$ to use an etchstopper at the time of the recess. In this case, two etchstop layers 102 whose thicknesses differ from each other's.

The p-type well and n-type well are respectively formed by ion-implantation of boron and phosphorous in the second step.

The third step uses a thermal oxide layer of more than 30 nm as a mask for the trench etching. The depth of the trench is over 150 nm and below 300 nm, and patterning is carried out so that the area where electrical elements are isolated, the region where a contact of a plate node 116 is formed, and the align-key necessary for the sixth step. After the formation of trench 104, boron or $BF_2$ is ion-implanted for doping the element-isolated area, and the oxide layer serving as the mask is removed.

Figure 3A:
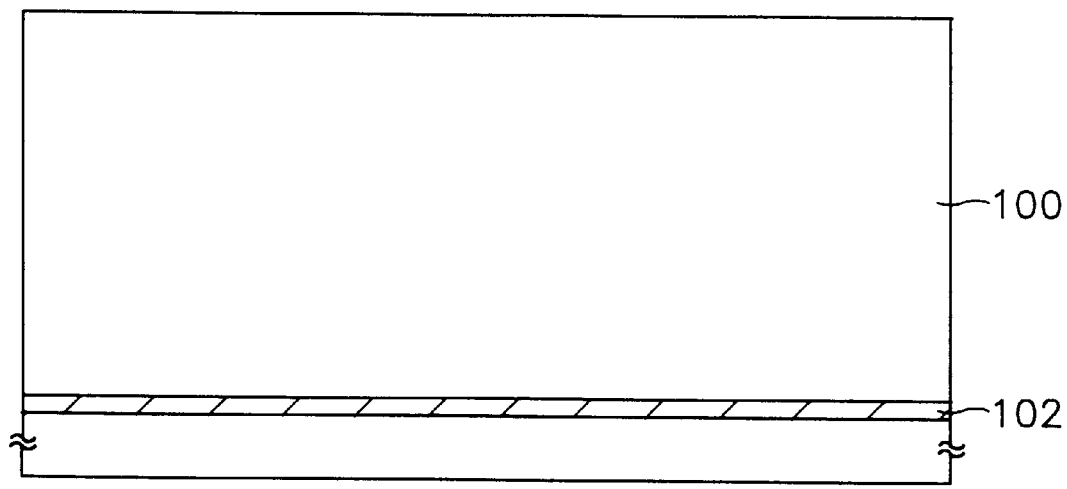
Figure 3B:
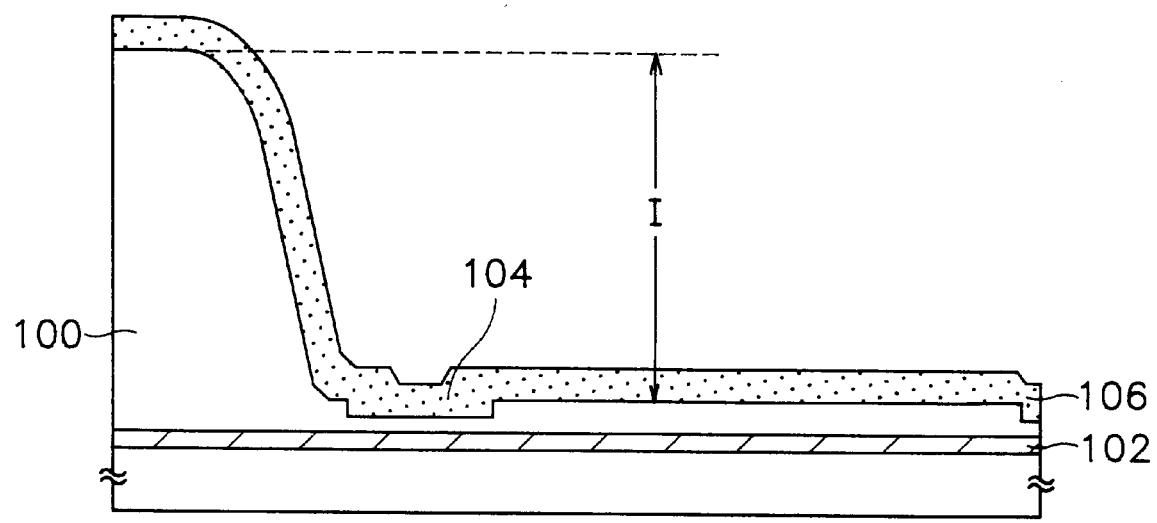
Figure 3C:
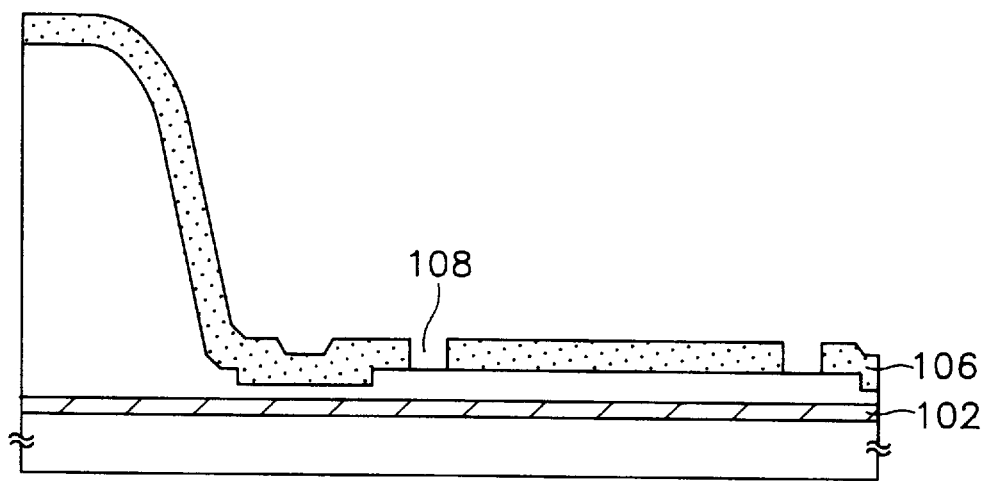
Figure 3D:
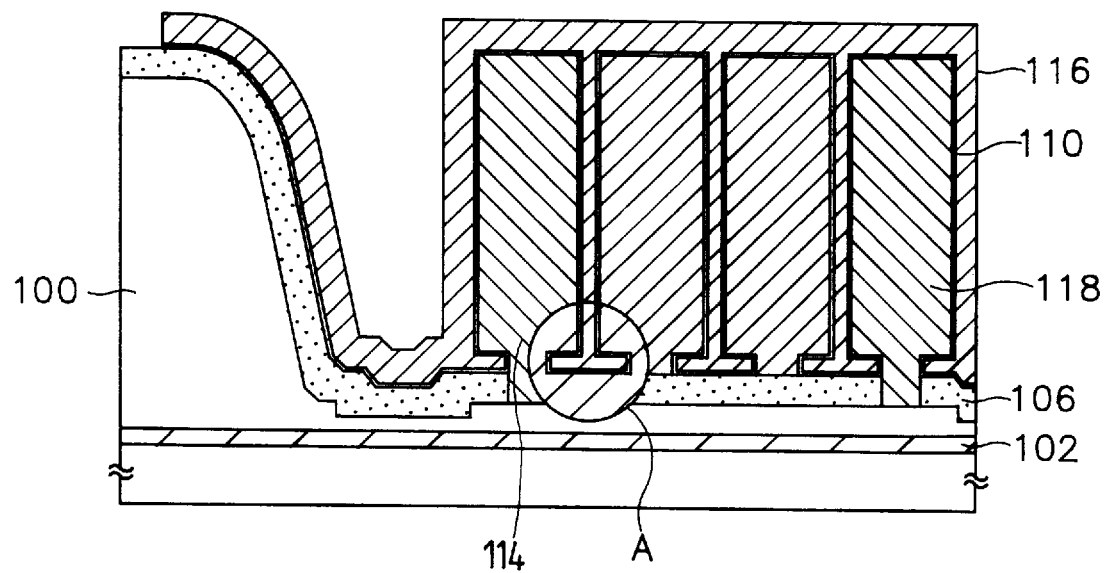
Figure 3E:
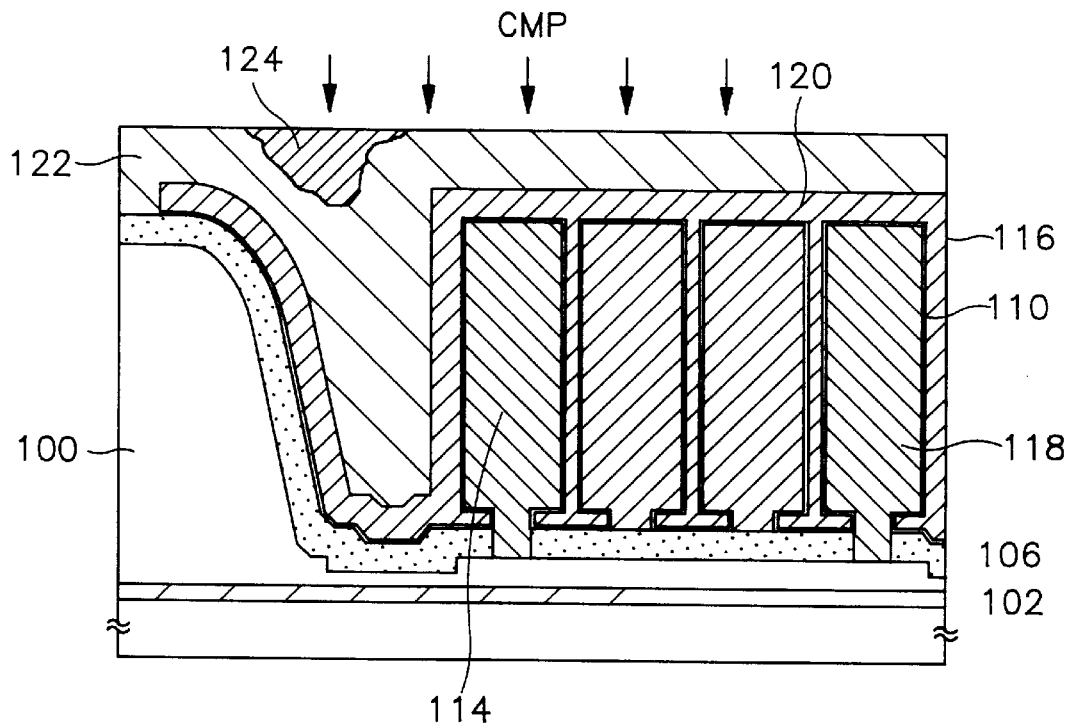
Figure 3F:
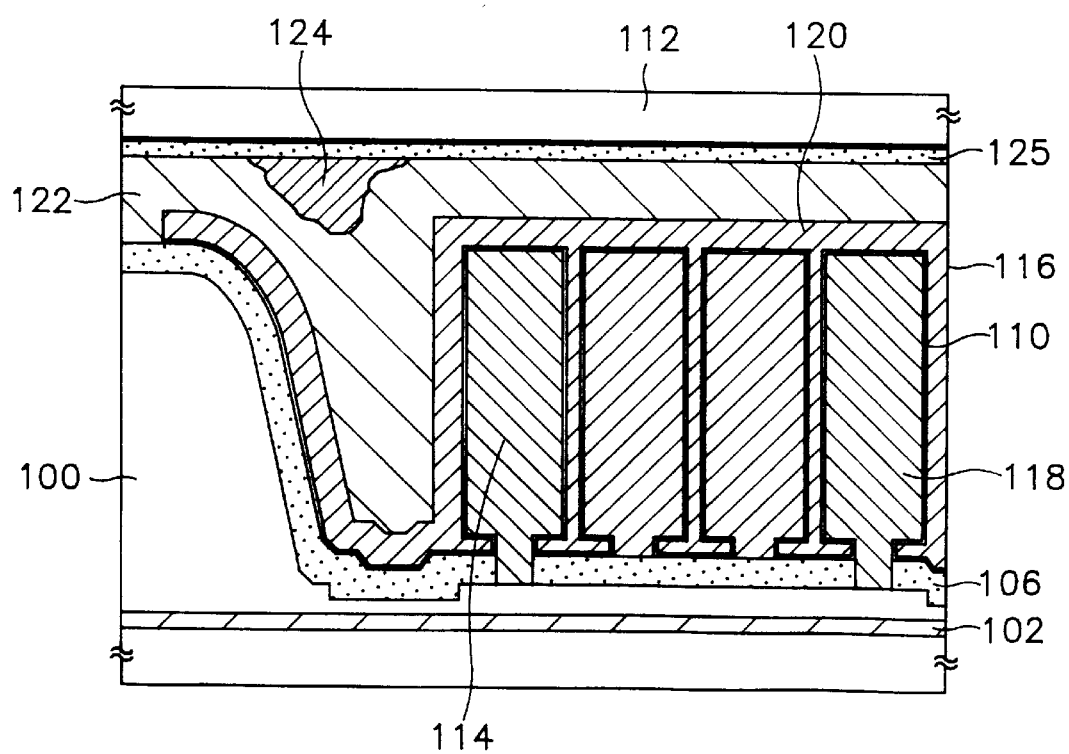
Figure 4:
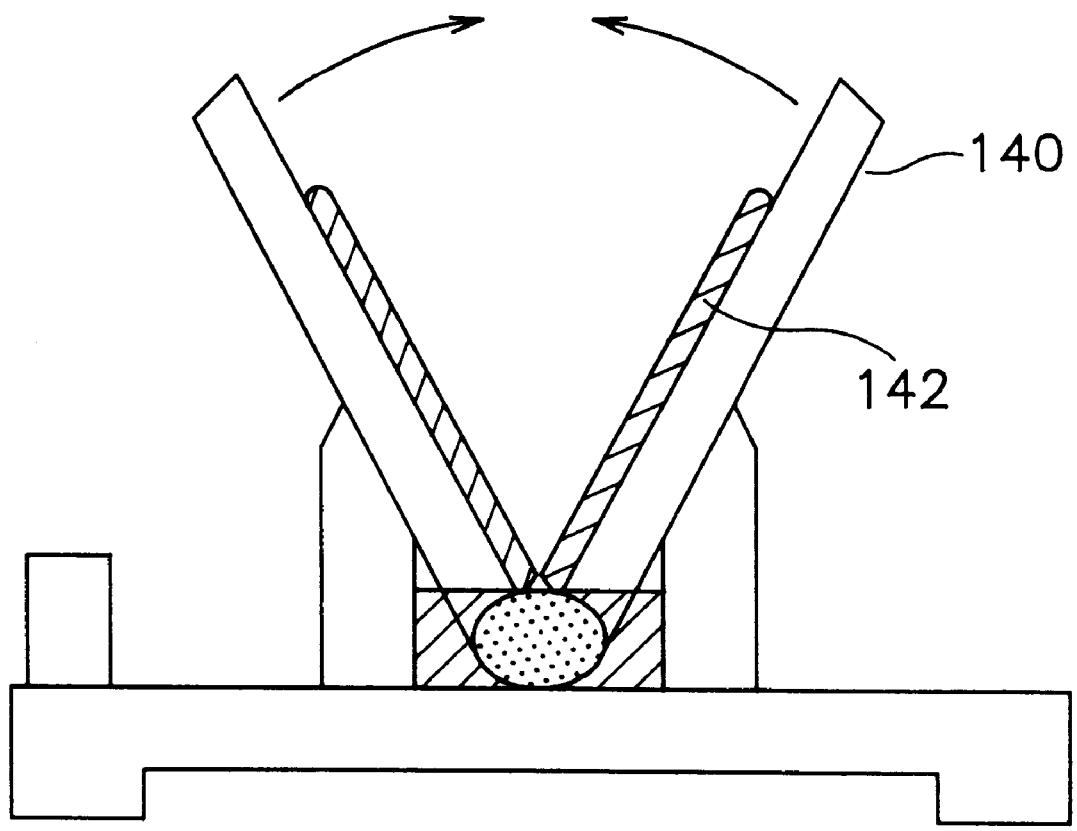
FIG. 4 depicts a joining machine that is used at the time of manufacturing the DRAM in accordance with the second preferred embodiment of this invention.

After the thermal oxide layer is grown to a thickness of 10 nm, and an oxide layer by CVD is applied thereto thickly more than the depth of the trench, a silicon nitride layer of 10 nm is deposited, and an oxide layer by CVD is deposited thereby making the resulting structure shown in FIG. 3B. The reason why the silicon nitride layer is inserted between the oxide layers is that a plate poly 120 is deposited between storage node 118 and buried oxide 106 (silicon oxide layer/silicon nitride layer) thereby increasing the capacitance of the capacitor and the SOI serves as a back gate.

In the fifth step, buried contact 108 is formed on the buried oxide 106 (thermal oxide+HTO+SiN+HTO), and this contact 108 connects the storage node to the thin SOI. Phosphorous is ion-implanted to the above contact.

The capacitor formed in the sixth step has a cylindrical shape or a crown shape in accordance with the design rule, required stored capacitance, etc. After in situ phosphorous doped poly silicon is applied to a thickness of more then 200 nm the depth of the recess in order that the planarity is acceptable at the time storage node 118 is patterned, and the align-key formed in the third step is exposed. Storage storage node 118 is patterned using a CMP method. The oxide layer is wet-etched provided the oxide layer applied in the fourth step is exposed by dry-etching storage poly 114. The silicon nitride layer formed in the fourth step serves as a stop layer for the etching process step. When silicon nitride layer/oxide layer (NO) dielectric layer is formed and in situ-doped poly is applied, plate poly 116 is applied between storage node 118 and the buried oxide layer, as shown in circle A of FIG. 3D. The plate poly 116 is applied to a thickness of 100 to 200 nm and patterned to have the configuration of FIG. 3D.

The seventh step polishes the global topology and undulated surface so that DWB process is possible. An oxide layer 122 formed by CVD and a borophosphorsilicate glass (BPSG) is applied and reflow is carried out at a temperature greater than 800° C. Polysilicon 124 is applied and the CMP process is carried out to form the resulting structure of FIG. 3E. The BPSG layer 122 serves as a stopping layer for this CMP process. The oxide layer by CVD (including the BPSG 122) is overlaid and thermal treatment is carried out to complete the planarization.

The eighth step is a step for joining the handle wafer 112 and the active wafer formed through the 7th step, and includes the following three sub-steps. As a first sub-step, the active wafer and the handle wafer to be joined together are dipped respectively in a mixed solution of sulfuric acid and aqueous hydrogen-peroxide of 130° C. and a mixed solution of liquid ammonia and aqueous hydrogenperoxide of 80° C. for a few minutes. The two wafers are dried and their particles are then removed such that their surfaces are terminated to an alkali radical.

As a second sub-step, the two wafers join the joining machine shown in FIG. 4, with the planarized surface of the active wafer facing the glass side of the handle wafer.

Table 1 below shows that misalignment of the rotational direction may be controlled at an angle of less than 0.01° if the wafers are joined together using the joining machine. Big misalignment causes a problem of alignment in the photo-etching process after the tenth step.

As a third sub-step, two wafers are thermally treated for more than two hours in an ambient atmosphere of nitrogen at a temperature of over 800° C., and, successively, a thermal oxide layer is formed in an ambient atmosphere of oxygen in order to increase joining intensity and remove voids of the joining interface. Forming the thermal oxide layer helps prevent the handle wafer from being damaged at the time of wet-etching the silicon.

TABLE 1

The Result of Gauging the Misalignment of the Rotational Direction After the Joining of the Two Wafers

| Sample No. | Measured Degree |
|---|---|
| 1 | 0.008 |
| 2 | 0.008 |
| 3 | 0.001 |

Figure 3G:
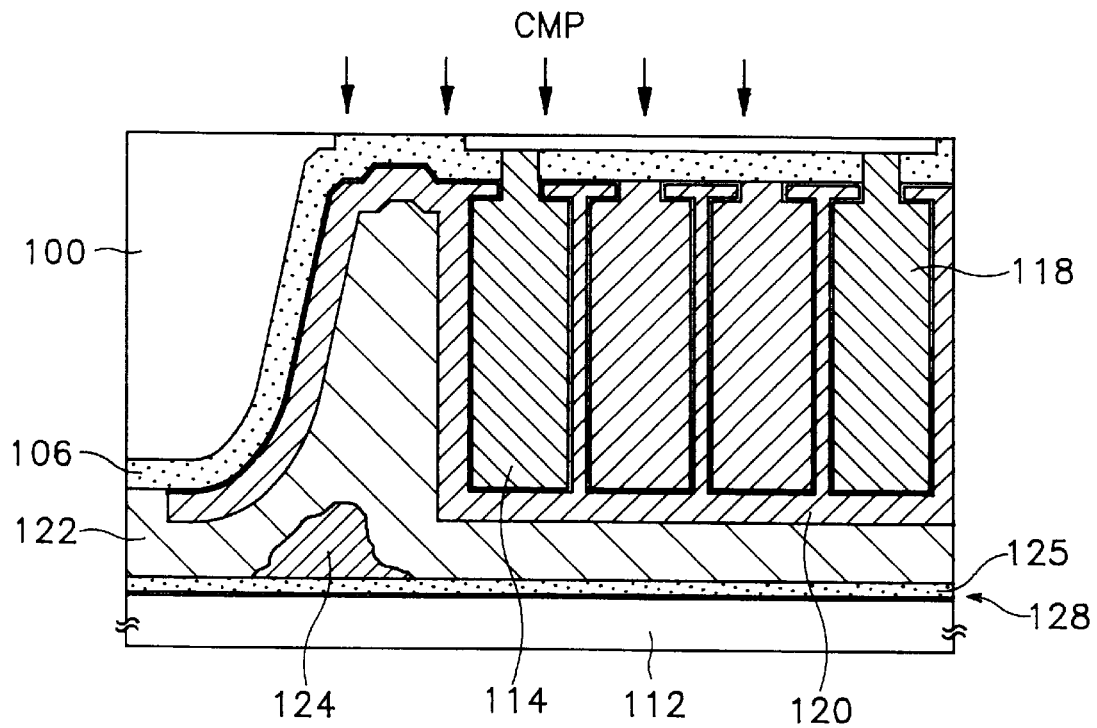
Figure 3H:
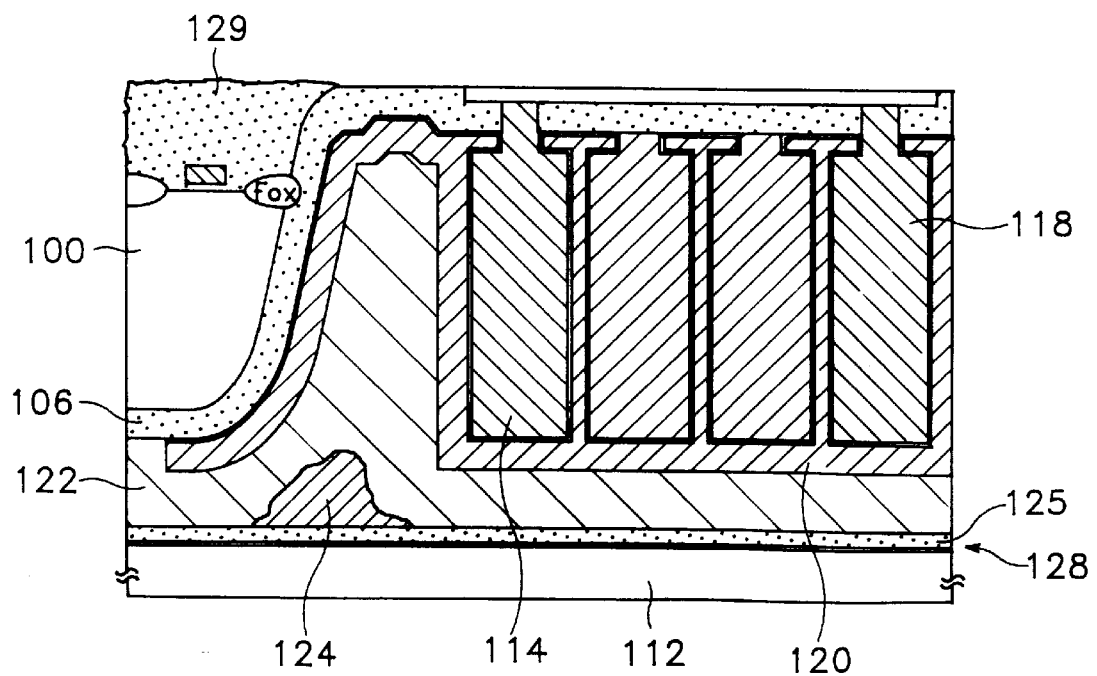
Figure 31:
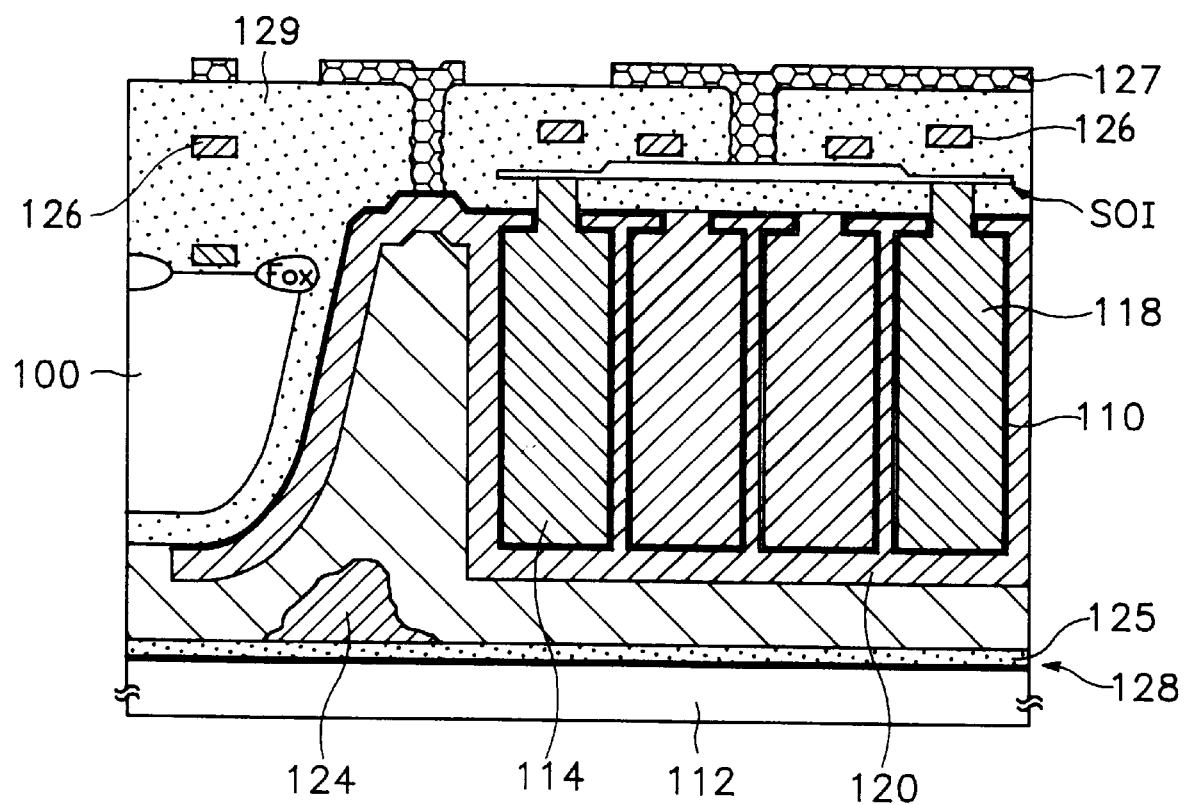

In the next 9th step, the active wafer passes through a series of backlapping/wet-etching/CMP. The backlapping is used for the purpose of enhancing the throughput, since the speed of removing the silicon by just CMP is too slow. The wet-etching removes silicon particles produced by the backlapping to decrease occurrence of scratches and deterioration of the wafer in the subsequent CMP process and uniform the thickness of the silicon layer by using the etchstopper. The silicon layer is thinned to a thickness of 50 $\mu$m by the backlapping, and is then thinned to several micro-meters by means of a mixed solution of KOH/IPA of about 80 C in the wet-etching. The remained silicon is thinned by CMP. The oxide layer filled in the trench in the fourth step serves as a polish stopper, as shown in FIG. 3G.

Referring now to the tenth step, the thin SOI area, i.e. the recessed area is covered with a silicon oxide layer/silicon nitride layer/silicon oxide layer. The silicon in the thick SOI area is wet-etched to form a step-like difference of about 300 nm between the thin SOI area and the thick SOI area. After that, isolation of electrical elements is performed in the thick SOI area by LOCOS. The oxide layer formed on the nitride layer in the thin SOI area is removed under the etching process of the oxide layer, and the nitride layer and the oxide layer formed underneath the nitride layer are remained.

In the eleventh step, after n-type and p-type MOS transistors, register patterns, etc. are formed, an oxide layer formed by CVD is applied such that it is higher than the top of the remaining silicon nitride layer in the thick SOI area by about 200 nm. The CVD oxide layer is planarized by CMP using the nitride layer as a stopper. The nitride layer and the oxide layer are wet-etched to yield the resulting structure shown in FIG. 3H.

In the twelfth step, a thermal oxide layer of 50 nm is formed. An oxide layer is formed having a thickness greater than 150 nm in the region having the phosphorous out-diffused in storage node 118 formed in the sixth step after the ion-implantation in the fifth step. The oxide layer of 60 nm is wet-etched and the gate oxide layer is again formed. Gate electrodes 124 are then formed, and source/drain is formed to form SOI transistor. The gate electrode 124 is formed of metal, e.g. W or composite of Ti nitride layer and metal, and then patterned to be a line of thick SOI region simultaneously with patterning the gate line. After that, a CVD oxide layer is applied as an interlayer insulating layer.

In the thirteenth step, a contact and a bit line contact are simultaneously formed over the plate node 116, cell, gate electrode of the peripheral circuit, metallization of the peripheral circuit.

Referring now to FIG. 3I, bit-line 127 is formed on the pattern where the contact is formed. The bit-line is formed of metal, and is patterned simultaneously with the line of the thick SOI region to have a structure of FIG. 3I. The reference numerals appearing in the drawing designate the following elements: ONO 110; an oxide layer 125; a bonded interface 128; and SiO$_2$ layer 129.

When it comes to the fifteenth step, customary semiconductor manufacturing processes such as passivation and alloying are carried out on the pattern to complete a DRAM.

In the first preferred embodiment of this invention, even if the storage node is raised to secure the capacitance of the capacitor at the time of manufacturing a DRAM, there is no problem with the step-like difference between the peripheral area and the memory cell area. Even if the device is highly integrated, the lateral surface area occupied by one capacitor is relatively small, but the height of the capacitor may be increased, such that sufficient capacitance can be secured. Since the method of manufacturing the DRAM begins with forming the capacitor, with the transistor being formed thereafter, potential deterioration of transistor characteristics is prevented due to a weak junction caused by the subsequent thermal treatment can be avoided. Thus, subsequent processing steps may be easily carried out.

Additionally, since the cell area is recessed by the shallow trench method, a thick oxide layer is not used for isolation of electrical elements to facilitate the formation of the contact for grounding the plate node of the capacitor on the borderline of the peripheral area and the cell area. Referring to the second preferred embodiment, the advantages of DWB and SOI techniques are maintained by forming the SOI devices just in the specified areas including the cell area, and problems such as step coverage and etch damage caused by increasing the planarity to overcome the step-like difference of the capacitor can be solved. The technique applied applied to the bulk silicon may be directly applied to the devices of the peripheral circuit(s).

What is claimed is:

1. A method of making a dynamic random access memory, comprising the steps of:
   providing a semiconductor substrate having a first substrate surface and an opposing second substrate surface;
   dividing the first substrate surface into a memory cell area and a peripheral circuit area;
   recessing the memory cell area of the first substrate surface in the memory cell area;
   forming a trench in the recessed memory cell area;
   forming a buried oxide layer over the first substrate surface;
   forming a substrate contact in the buried oxide layer;
   forming a capacitor in contact with the substrate through the substrate contact;
   forming a first oxide layer over the first substrate surface;
   planarizing the resultant structure after forming the first oxide layer;
   thinning the second substrate surface using the buried oxide layer as a stopper; and,
   forming at least one switching element on the second substrate surface opposite the recessed memory cell area of the first substrate surface.

2. The method of claim 1, wherein the step of forming the capacitor comprises the substeps of:
   depositing a doped polysilicon layer;
   patterning the doped polysilicon layer; forming a dielectric layer over the patterned polysilicon layer; and,
   forming a plate poly layer over the dielectric layer.

3. The method of claim 2, further comprising the steps of:
   forming a second oxide layer on the second substrate surface over the at least one switching element; and,
   forming a bit line on the second oxide layer.

4. The method of claim 3, wherein the bit line contacts the plate poly layer.

5. The method of claim 1, further comprising the steps of:

preparing a substrate by selective ion implantation into a silicon wafer;

providing an etch stopper layer to the second substrate surface.

6. The method of claim 1, wherein the step of planarizing the resultant structure after forming the first oxide layer; comprises the substeps of:

chemically and mechanically polishing the resultant structure after forming the first oxide layer; and, bonding a handling wafer to the planarized first oxide layer.

7. A method of making a dynamic random access memory, comprising the steps of:

providing a semiconductor substrate having a first substrate surface and a second substrate surface;

dividing the first substrate surface into a memory cell area and a peripheral circuit area;

recessing the memory cell area of the first substrate surface by a first depth;

forming a capacitor having a height less than the first depth in the memory cell area;

forming a first oxide layer over the first substrate surface following formation of the capacitor;

chemically and mechanically planarizing the first oxide layer;

terminating a first surface of a handling wafer and the planarized first oxide layer in an alkali radical;

bonding together the first surface of the handling wafer and the planarized first oxide layer.

8. The method of claim 7, wherein the step of terminating the first surface of the handling wafer and the planarized first oxide layer in an alkali radical comprises the substeps of:

dipping one of the first surface of the handling wafer and the planarized first oxide layer in a first solution of sulfuric acid and aqueous hydrogenperoxide; and dipping one of the first surface of the handling wafer and the planarized first oxide layer in a second solution of liquid ammonia and aqueous hydrogenperoxide.

9. The method of claim 7, wherein the step of bonding together the first surface of the handling wafer and the planarized first oxide layer comprises the substeps of:

mechanically joining the first surface of the handling wafer and the planarized first oxide layer; and, thermally treating the mechanically joined surfaces.

10. The method of claim 9, further comprising the steps of:

thinning the second substrate surface using the buried oxide layer as a stopper;

forming at least one switching element on the thinned second substrate surface opposite the recessed memory cell area of the first substrate surface.

11. A method of making a dynamic random access memory, comprising the steps of:

providing a semiconductor substrate having a first substrate surface and an opposing second substrate surface;

dividing the first substrate surface into a memory cell area and a peripheral circuit area;

recessing the memory cell area of the first substrate surface;

forming a trench in the recessed memory cell area where an isolation region is to be formed;

forming a buried oxide layer over the first substrate surface;

forming a substrate contact in the buried oxide layer;

forming a capacitor in contact with the substrate through the substrate contact;

forming a first oxide layer over the first substrate surface;

planarizing the resultant structure after forming the first oxide layer;

thinning the second substrate surface using the buried oxide layer as an etch stopper; and, forming at least one switching element on the second substrate surface opposite the recessed memory cell area of the first substrate surface.

12. The method of claim 11, further comprising the steps of:

preparing the semiconductor substrate by selective ion implantation into a silicon wafer; and, providing an etch stopper layer on the second substrate surface.

13. The method of claim 11, wherein the step of planarizing the resultant structure after forming the first oxide layer; comprises the substeps of:

chemically and mechanically polishing the resultant structure after forming the first oxide layer; and, bonding a handling wafer to the planarized first oxide layer.

14. The method of claim 11, wherein the memory cell area is recessed by a depth greater than a height of the capacitor formed in the memory cell area.

15. The method of claim 1, wherein the recessed depth of the memory cell area is greater than the height of a capacitor formed in the memory cell area.

* * * * *